Nov. 15, 1966 W. BACHNICK ET AL 3,286,195

TRANSISTOR OSCILLATOR FOR UHF TUNERS WITH INCREASED FREQUENCY RANGE

Filed May 4, 1964

Inventors:
Werner Bachnick
Werner Heitefuss

By: Spencer & Kaye
ATTORNEYS

United States Patent Office 3,286,195
Patented Nov. 15, 1966

3,286,195

TRANSISTOR OSCILLATOR FOR UHF TUNERS WITH INCREASED FREQUENCY RANGE

Werner Bachnick, Bredenbeck, and Werner Heitefuss, Hannover, Germany, assignors to Telefunken Patentverwertungsgesellschaft m.b.H., Ulm (Danube), Germany Filed May 4, 1964, Ser. No. 364,473
Claims priority, application Germany, May 2, 1963, T 23,941
11 Claims. (Cl. 331—97)

The present invention relates to a tuner, and, more particularly, to a tuner suitable for use in the UHF (ultra-high frequency) band.

German Patent No. 953,441 shows a transistor oscillator in which the transistor is connected in common base circuit and in which the feedback path is constituted by a capacitor connected across the emitter and collector electrode. Such a circuit has the drawback that, when it is used for higher frequencies, a change in the oscillator frequency in the region of the lower oscillator frequencies will tend to stop the oscillations. This is due mainly to the fact that, at higher frequencies, the feedback capacitor can not simply be made as large as desired because then the oscillations would, at the higher oscillator frequencies, become irregular. The oscillator would then tend to change back and forth between operation as a sinusoidal oscillator and operation as a saw-tooth oscillator. This, then, limits the maximum size of the feedback capacitor, so that the above-described oscillator is not suitable for the higher frequency ranges of a continually tunable oscillator band.

It is, therefore, the primary object of the present invention to improve the above-described oscillator circuit—which, except for the above-described drawback, has been found to be a rather desirable oscillator circuit, mainly because of its simplicity—i.e., to make the oscillator circuit suitable for operation in the higher frequency ranges and thereby obtain a relatively wide frequency band throughout which the tuner may be tuned.

With the above object in view, the present invention resides, essentially, in an oscillator of the above type, namely, a transistor oscillator for UHF tuners in which a feedback capacitor is connected across the emitter and the collector, which oscillator additionally is provided with second feedback means, constituted by an inductive coupling between the emitter and collector circuitry. In this way, the feedback of the oscillator circuit is increased for the low frequencies of the frequency range throughout which the oscillator is to be tuned.

Additional objects and advantages of the persent invention will become apparent upon consideration of the following description when taken in conjunction with the accompanying drawings in which.

Figure 1:
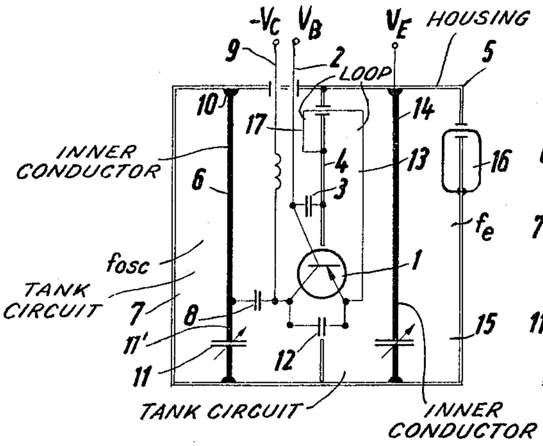
FIGURE 1 is a schematic diagram of one embodiment of a tuner according to the present invention.
Figure 2:
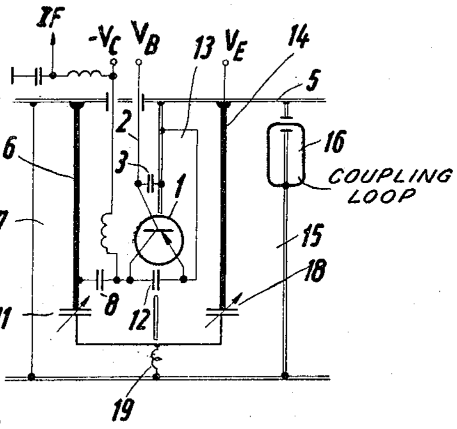
FIGURE 2 is a schematic diagram of another embodiment of a tuner according to the present invention.

Referring now to the drawings and to FIGURE 1 thereof in particular, the same shows an oscillator circuit which comprises a transistor 1 connected in so-called common (or grounded) base configuration. The base voltage $V_B$ is applied via a line 2 which, in the region of the base connection, is connected to the wall 4 of the tank circuit housing 5 (constituting ground) via a capacitor 3, so that the base of the transistor is at ground potential insofar as high frequencies are concerned. The collector of transistor 1 is connected to the inner conductor 6 of the tank circuit 7 via a capacitor 8, this capacitor serving to block the collector voltage $V_C$ applied via a further line 9. The tank circuit 7 is constituted as a $\lambda/4$ (quarter wave length) tank circuit so that the end 10 of the inner conductor 6 is connected directly to ground while the opposite end 11' of conductor 6 is non-grounded but connected to ground via a tuning capacitor 11. Tank circuit 7 is tuned to the oscillator frenquency, $f_{osc}$. A capacitor 12, which is connected across the collector and emitter provides a feedback path for the oscillator, the emitter being connected to ground via an inductance 13. As is shown in FIGURES 1 and 2, a continuation of housing wall 4 extends below capacitor 12, wall 4 and its continuation serving as a boundary between tank circuit 7 and 15. Inductance 13 is so configured that it also serves as a coupling loop in the region of the inner conductor 14 of the tank circuit 15, which has the input signals applied to it via coupling loop 16, tank circuit 15 being tuned to the input signal frequency $f_e$.

The arrangement as described so far represents an oscillator in accordance with the known art. Such an oscillator has, as described above, the drawback that it can not be operated at very high frequencies because it would then no longer produce satisfactory sinusoidal oscillations. For this reason, the feedback capacitor 12 has to be kept very small, and this, in turn, will cause the amplitude of the oscillations to vary throughout the tuning range of the tuner. In accordance with the embodiment of FIGURE 1 of the present invention, this disadvantage is eliminated by grounding the inductance 13 not in the region of the tank circuit 15 but in the region of the tank circuit 7, whereat it is configured, in the region of the current antinode, as a coupling loop 17. Consequently, the emitter inductance acts as a second feedback path which increases the feedback for the low frequencies of the band throughout which the oscillator is to be tuned. The resonant frequency of the circuit constituted by this emitter inductance and the input capacitance of the transistor is so selected as to remain below the lowest oscillator frequency, but nevertheless close enough thereto to make possible a sufficiently large feedback amplitude.

It will be understood that the circuit of FIGURE 1 may, instead of being constituted as a self-oscillating mixer stage, be operated as a straight oscillator circuit, in which case the emitter inductance 13 would be configured, in the region of the tank circuit 15, not as a coupling loop but as a lumped inductance; the inductance 13 would be configured as a coupling loop only in the region of the tank circuit 7.

FIGURE 2 shows a self-oscillating mixer stage incorporating the same circuit components as are shown in FIGURE 1. In the circuit of FIGURE 2, use is made of the fact that the inner conductor 14 of tank circuit 15 is coupled with the emitter electrode via coupling loop 13 and that the tuning capacitors 11, 18 of both tank circuits are operated by a common shaft. Here, the second feedback is obtained by grounding those electrodes of the tuning capacitors 11, 18 which are away from the short-circuited or non-grounded ends of the respective inner conductors 6, 14 (i.e., the lower plate of each capacitor, as viewed in FIGURE 2), via a common inductance 19. This inductance 19 thus serves as a common reference-point inductance which coupled the two tank circuits with each other. In this arrangement, the feedback is increased in the region of the lower oscillator frequencies because the inductance 19 becomes increasingly more effective during tuning to lower frequencies because the capacitances will, in such case, be increased by the tuning. Furthermore, the resonant frequency of the circuit constituted by the loop 13 together with the capacitances connected thereto is lower than the lowest oscillator frequency.

Figure 3:
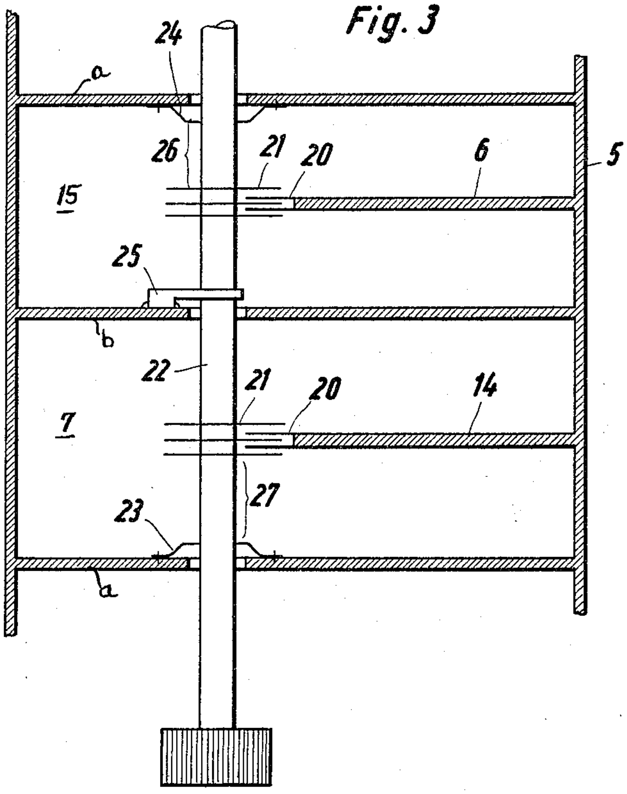
FIGURE 3 is a fragmentary cross sectional view, on an enlarged scale, showing a portion of the tuner of FIGURE 2.

FIGURE 3 shows a practical embodiment of the circuit of FIGURE 2. The inner conductors 6 and 14 each have their grounded end connected to the wall of the housing 5, while the non-grounded end of each conductor is connected to the stationary plate 20 of a respective variable capacitor. The movable capacitor plates 21 pertaining to each set of stationary plates 20 are mounted on an electrically conductive shaft 22, without the intermediary of insulating layers. The shaft is grounded, via brushes 23 and 24, at those points at which it passes through the outer conductors *a* of the two tank circuits 7 and 15. The brushes 23 and 24 will, in practice, be arranged to have substantially no inductance.

The shaft 22 passes through the wall *b* between the two tank circuits 7 and 15 at a point on the shaft which is approximately midway between the two tuning capacitors. At this point, the shaft is contacted by a relatively narrow brush 25 constituted, for example, by a leaf spring, only one end of which is attached to the wall so that this brush will have a relatively small inductance. The magnitude of the inductance of the brush 25 can be adapted to the particular design needs of the tuner simply by making the brush of the proper width. For calibrating purposes, the brush may be made comb-like, so that the inductance formed by the brush can be descreased, by bending one or more individual contact tongues away from the shaft. The total inductance, corresponding to inductance 19 of FIGURE 2, is composed of the inductance of brush 25 as well as the inductances of the portions 26 and 27 of shaft 22 which lie in parallel therebetween, each between ground and the nearest capacitor. In a practical embodiment of the tuner, the total inductance is, for example, between 2 and 3 nh. (nanohenries).

It will be understood that the above description of the present invention is susceptible to various changes, modifications, and adaptation, and the same are intended to be comprehended within the meaning and range of equivalents of the appended claims. For example, not only the oscillator of FIGURE 1, but also the oscillator of FIGURE 2 may, instead of being self-oscillating mixer stage, be fashioned to operate solely as an oscillator.

With one embodiment of the invention there have been used following circuit elements:

| | |
|---|---|
| Transistor **1** | Philco 2896 or 2398. Texas Instruments GM0290. |
| Capacitor **3** | 200 picofarads. |
| Capacitor **8** | 7 picofarads. |
| Capacitors **11**, **18** | 2–14 picofarads. |
| Capacitor **12** | 0.6 picofarads (only with Philco transistor 1). |
| Loop **13**+**17** | 10–15 nanohenries. |

What is claimed is:

1. An oscillator comprising in combination:

(a) quarter wave length resonant tank circuit means including a housing constituting a grounded outer conductor for said tank circuit means, and a transistor provided with a base, an emitter and a collector disposed in said housing, said base being grounded to said housing and said collector being electrically coupled with said tank circuit means, said tank circuit means cooperating with said transistor for providing high frequency oscillations;

(b) a capacitor connected across said emitter and collector said capacitor providing a first feedback path; and (c) inductive coupling means connected between said emitter and said collector for providing a second feedback path which increases the feedback of the lower frequencies of the frequency range through which the oscillator is to be tuned.

2. An oscillator as defined in claim 1 wherein said tank circuit means include emitter and collector tank circuits each incorporating an inner conductor having one non-grounded end and the other end grounded to said housing, and two tuning capacitors each having one electrode connected to the non-grounded end of a respective one of said inner conductors; and wherein said inductive coupling means comprise means for grounding the other electrode of both of said tuning capacitors through a common inductance.

3. An oscillator as defined in claim 2 wherein said tuning capacitors are operated by a common shaft, and wherein said grounding means comprises a resilient brush one end of which is grounded and the other of which slides in electrical contact with said shaft.

4. An oscillator as defined in claim 3 wherein said brush engages said shaft at a point thereon which is approximately midway between said tuning capacitors, in consequence of which said two tuning capacitors are grounded by said brush.

5. An oscillator as defined in claim 4 wherein said grounding means further comprise two further, parallel inductances constituted, respectively, by those portions of said shaft which extend, respectively, between the capacitors and outer conductors of said tank circuits.

6. An oscillator as defined in claim 1 wherein said tank circuit means include a collector tank circuit and said inductive coupling means comprise an inductance which connects said emitter to ground, a portion of said inductance being electrically connected to said collector circuit.

7. An oscillator as defined in claim 6 wherein said portion of said coupling inductance means passes through the current antinode of said collector tank circuit.

8. An oscillator comprising, in combination:

(a) a transistor having a base, an emitter and a collector which are connected in common base configuration;

(b) means forming two quarter wave length tank circuits associated with said emitter and collector, respectively, constitute emitter and collector circuits, respectively;

(c) a capacitor connected across said emitter and collector, said capacitor providing a first feedback path; and (d) inductive coupling means connected between said emitter and collector circuits for providing a second feedback path which increases the feedback of the lower frequencies of the frequency range through which the oscillator is to be tuned.

9. An oscillator as defined in claim 8 wherein each of said tank circuits includes a grounded outer conductor and an inner conductor having a grounded end and a non-grounded end, and a tuning capacitor one electrode of which is connected to the non-grounded end; and wherein said inductive coupling means comprise means for grounding the other electrode of both of said tuning capacitors through a common inductance.

10. An oscillator as defined in claim 8 wherein said inductive coupling means comprise an inductance for grounding said emitter, a portion of said inductance being part of said emitter circuit and another portion of said inductance being part of said collector circuit.

11. In an oscillator having a transistor provided with a base, an emitter and collector, which transistor is connected in common base configuration, means forming quarter wave length emitter and collector tank circuits associated with the emitter and collector, respectively, to constitute emitter and collector circuits, respectively, and a capacitor connected across the emitter and collector and providing a first feedback path, the improvement which comprises an inductive coupling connected between the emitter and collector circuits for prodiving a second feedback path which increases the feedback of the lower frequencies of the frequency range through which the oscillator is to be tuned.

No references cited.

ROY LAKE, *Primary Examiner.*

S. H. GRIMM, *Assistant Examiner.*